(12) United States Patent
Lee et al.

(10) Patent No.: US 7,531,372 B2
(45) Date of Patent: May 12, 2009

(54) METHOD FOR MANUFACTURING ARRAY SUBSTRATE FOR LIQUID CRYSTAL DISPLAY DEVICE

(75) Inventors: Hyun-Kyu Lee, Seoul (KR); Yong-In Park, Seoul (KR)

(73) Assignee: LG Display Co., Ltd., Seoul (KR)

( * ) Notice: Subject to any disclaimer, the term of this patent is extended or adjusted under 35 U.S.C. 154(b) by 402 days.

(21) Appl. No.: 11/367,363

(22) Filed: Mar. 6, 2006

(65) Prior Publication Data

US 2006/0186527 A1 Aug. 24, 2006

Related U.S. Application Data

(62) Division of application No. 09/984,027, filed on Oct. 26, 2001, now abandoned.

(30) Foreign Application Priority Data

Oct. 28, 2000 (KR) ............................... 2000-63745

(51) Int. Cl.
*H01L 21/00* (2006.01)
(52) U.S. Cl. ........................................ 438/29; 438/455
(58) Field of Classification Search .................. 438/22, 438/29, 455
See application file for complete search history.

(56) References Cited

U.S. PATENT DOCUMENTS

| | | | |
|---|---|---|---|
| 4,610,510 A | 9/1986 | Funada et al. | |
| 5,339,180 A * | 8/1994 | Katoh | 349/46 |
| 5,365,356 A | 11/1994 | McFadden | |
| 5,476,810 A | 12/1995 | Curran | |
| 5,796,121 A * | 8/1998 | Gates | 257/59 |
| 5,898,322 A | 4/1999 | Kubota et al. | |
| 5,969,377 A | 10/1999 | Seo | |
| 6,150,668 A | 11/2000 | Bao et al. | |
| 6,246,070 B1 | 6/2001 | Yamazaki et al. | |
| 6,274,412 B1 | 8/2001 | Kydd et al. | |
| 6,407,787 B1 | 6/2002 | Sekime et al. | |

(Continued)

FOREIGN PATENT DOCUMENTS

JP 2-278879 11/1990

(Continued)

OTHER PUBLICATIONS

Theiss et al., IEEE Electron Device Letters, Amorphous Silicon Thin-Film Transistors on Steel Foil Sunstrates, vol. 17, No. 12 Dec. 1996 pp. 578-580.*

(Continued)

*Primary Examiner*—Zandra Smith
*Assistant Examiner*—Seth Barnes
(74) *Attorney, Agent, or Firm*—Morgan Lewis & Bockius LLP

(57) ABSTRACT

A method of fabricating an array substrate includes forming a buffer layer on a metal substrate, forming a thin film transistor including a gate electrode, a source electrode and a drain electrode on the buffer layer, forming a pixel electrode contacting the drain electrode, removing the metal substrate to expose a lower surface of the buffer layer, and forming a plastic material beneath the buffer layer such that the plastic material contacts the exposed lower surface of the buffer layer.

8 Claims, 4 Drawing Sheets

U.S. PATENT DOCUMENTS

| | | | |
|---|---|---|---|
| 6,534,382 B1 * | 3/2003 | Sakaguchi et al. | 438/455 |
| 2001/0022646 A1 * | 9/2001 | Nishi et al. | 349/187 |
| 2002/0019081 A1 * | 2/2002 | Denis et al. | 438/149 |
| 2002/0068390 A1 | 6/2002 | Gosain et al. | |
| 2003/0003389 A1 | 1/2003 | Pokorny et al. | |
| 2003/0032210 A1 * | 2/2003 | Takayama et al. | 438/30 |
| 2008/0239230 A1 * | 10/2008 | Yamazaki et al. | 349/153 |

FOREIGN PATENT DOCUMENTS

| | | |
|---|---|---|
| JP | 4-199638 | 7/1992 |
| JP | 08-278519 | 10/1996 |
| JP | 11-231347 | 8/1999 |
| KR | 2001-047795 | 6/2001 |

OTHER PUBLICATIONS

Serikawa et al., IEEE Electron Device Letters, High Mobility Poly-Si TFT's Fabricated on Flexible Stainless-Steel Substrates, vol. 20, No. 11, Nov. 1999, pp. 574-576.*

Howell et al., IEEE Electron Device Letters, Poly-Si Thin Film Transistors on Steel Substrates, vol. 21, No. 2, Feb. 2000, pp. 70-72.*

* cited by examiner

METHOD FOR MANUFACTURING ARRAY SUBSTRATE FOR LIQUID CRYSTAL DISPLAY DEVICE

This application is a Divisional of U.S. patent application Ser. No. 09/984,027, filed Oct. 26, 2001, now abandoned and claims the benefit of Korean Patent Application No. P2000-63745, filed on Oct. 28, 2000 in Korea, both of which are hereby incorporated by reference in their entirety.

BACKGROUND OF THE INVENTION

1. Field of the Invention

The present invention relates to a liquid crystal display (LCD) device and a method for fabricating the same, and more particularly, to an array substrate having thin film transistors for a liquid crystal display (LCD) device and a method for fabricating the array substrate using flexible materials.

2. Discussion of the Related Art

A liquid crystal display (LCD) device uses optical anisotropy characteristics of liquid crystal molecules to display images. Typical LCD devices include upper and lower substrates with a liquid crystal material interposed therebetween.

FIG. 1 is an exploded perspective view illustrating a typical LCD device. The LCD device includes an upper substrate 9 and a lower substrate 11 opposing each other and a liquid crystal layer 14 interposed therebetween. The upper substrate 9 and the lower substrate 11 are commonly referred to as a color filter substrate and an array substrate, respectively. A substrate 5, a black matrix 6 and a color filter layer 7 that includes a plurality of sub-color-filters red (R), green (G), and blue (B) are formed on the upper substrate 9. The black matrix 6 surrounds each of the sub-color-filters to form an array matrix. Additionally, a common electrode 18 is formed to cover the color filter layer 7 and the black matrix 6 on the upper substrate 9.

The lower substrate 11 includes a plurality of thin film transistors (TFTs) "T" arranged in an array matrix on a substrate 22 corresponding to the color filter layer 7. Each of the TFTs "T" function as switching elements. In addition, a plurality of crossing gate lines 13 and data lines 15 are orthogonally disposed on the lower substrate 11 such that each of the TFTs "T" are located near a corresponding crossing portion of the gate lines 13 and the data lines 15, thereby defining a pixel region "P." In the pixel region "P," a pixel electrode 17 is disposed and is made of a transparent conductive material such as indium tin oxide (ITO), for example.

Liquid crystal molecules of the liquid crystal layer 14 are aligned according to electric signals applied by the TFTs "T," thereby controlling incident rays of light to display an image. Specifically, electrical signals applied to the gate line 13 and the data line 15 are transmitted to a gate electrode and a source electrode of each the TFTs "T," respectively. The signal applied to the drain electrode is transmitted to the pixel electrode 17, thereby aligning the liquid crystal molecules of the liquid crystal layer 14 in a first direction. Then, light generated from a backlight (not shown in the figure) selectively passes through the liquid crystal layer 14 to display an image.

A fabricating process for the above-described array substrate requires repeated steps of deposition and patterning of various layers. The patterning steps implement photolithographic processing steps, i.e., a masking step, including selective light exposure using a mask, i.e., a photomask. Since one cycle of the photolithographic processing step is facilitated with a single mask, the total number of masks used in the fabrication process is a critical factor in determining the necessary total number of patterning steps. Furthermore, as fabricating processes for the array substrate become more simplified, fabrication errors associated with the fabricating processes may decrease. Moreover, other processing steps such as etching and striping, for example, are also repeated during fabrication of the array substrate.

FIG. 2 is an enlarged plan view illustrating a pixel of a related art array substrate 11 for a liquid crystal display. In the FIG. 2, the array substrate 11 includes a pixel "P" defined by crossing gate and data lines 13 and 15, respectively. The pixel "P" includes a TFT "T" as a switching element, the pixel electrode 17, and a storage capacitor "C." The TFT "T" includes a gate electrode 26, a source electrode 28, a drain electrode 30, and an active layer 55. The source electrode 28 is electrically connected to the data line 15, and the gate electrode 26 is electrically connected to the gate line 13.

FIG. 3 is a cross sectional view along II-II of FIG. 2, showing a related art array structure resulting from a conventional fabricating sequence. In FIG. 3, a transparent glass substrate 22 is used to form a switching element thereon. The thin film transistor "T" including the gate electrode 26, the source electrode 28 and the drain electrode 30 is formed on the substrate 22. A passivation layer 29 is subsequently formed on the thin film transistor "T" and the pixel electrode 17 that contacts the drain electrode 30 is formed thereon.

In the conventional process described above, mechanical characteristics of the material for the substrate 22, such as that of glass or quartz, are rigid so that the fabrication processes can be done easily due to minimize deformation of the substrate. However, any concentrated point loading, such as an external impact, can fracture the material.

SUMMARY OF THE INVENTION

Accordingly, the present invention is directed to an array substrate for a liquid crystal display device and a method for fabricating the same that substantially obviates one or more of problems due to limitations and disadvantages of the related art.

An object of the present invention is to provide an array substrate which is made of a flexible material and a method for fabricating the same that is flexible and can dampen external impacts.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, an array substrate for a liquid crystal display device includes a flexible substrate, a buffer layer on the substrate, a thin film transistor including a gate electrode, a source electrode and a drain electrode on the buffer layer, and a pixel electrode on the thin film transistor.

In another aspect, a method for fabricating an array substrate includes the steps of forming a buffer layer on a metal substrate, forming a thin film transistor including a gate electrode, a source electrode and a drain electrode on the buffer layer, forming a pixel electrode contacting the drain electrode, removing the metal substrate, and forming a plastic material beneath the buffer layer.

In another aspect, a liquid crystal display device includes an elastic substrate, a buffer layer on the substrate, a thin film transistor including a gate electrode, a source electrode and a drain electrode on the buffer layer, a passivation layer on the thin film transistor, and a pixel electrode on the passivation layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments of the present invention, which are illustrated in the accompanying drawings.

Figure 1:
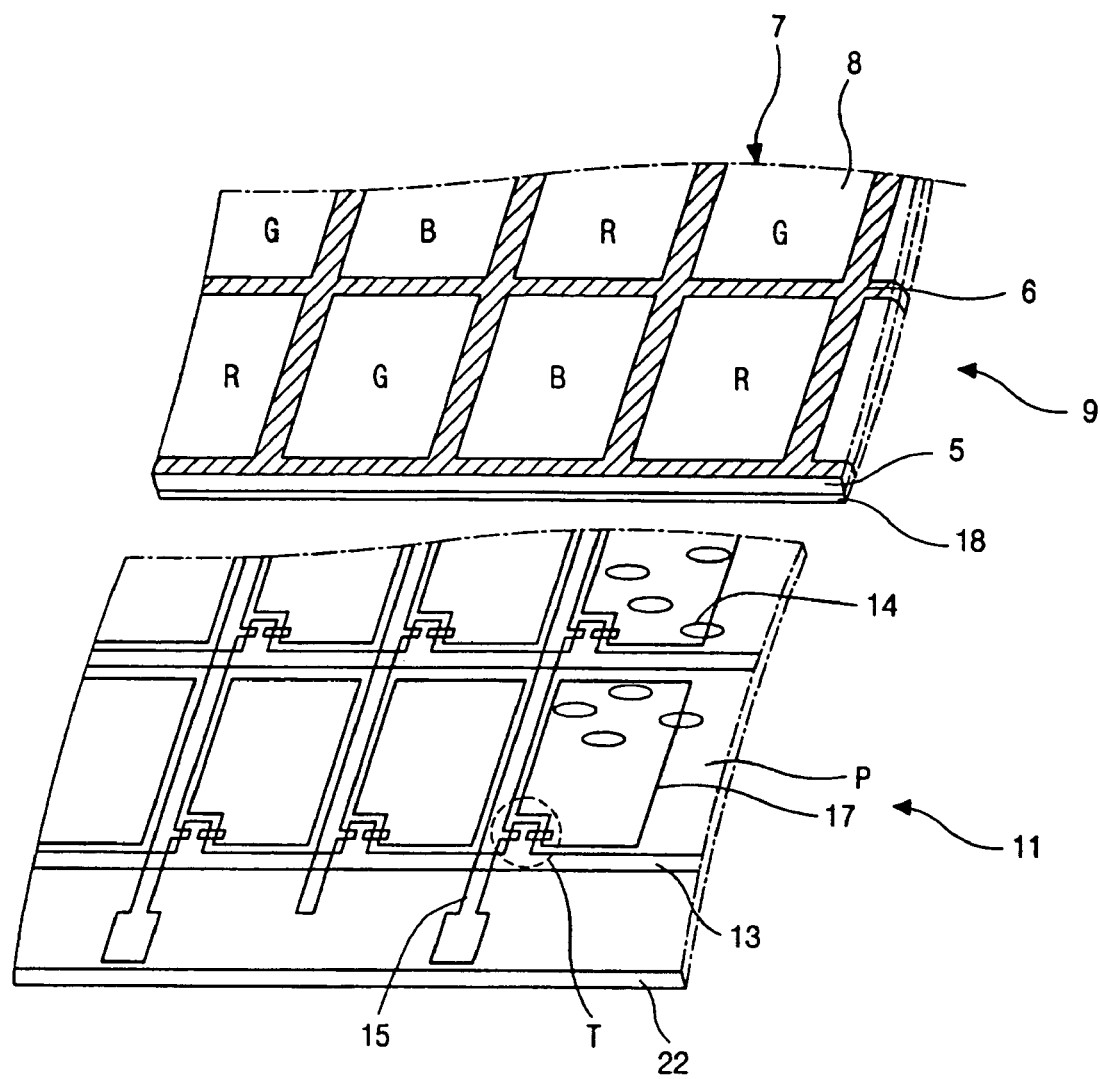
FIG. 1 is an exploded perspective view showing a color liquid crystal display device of the related art.
Figure 2:
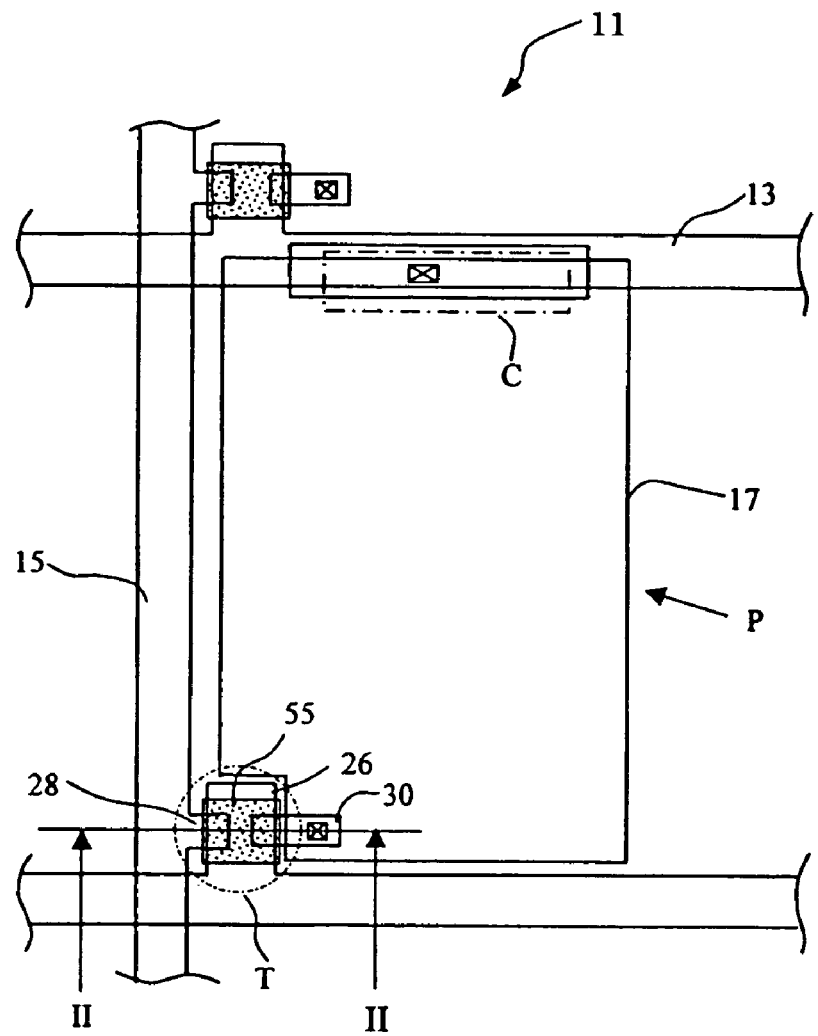
FIG. 2 is an enlarged plan view showing a pixel of an array substrate for a liquid crystal display device of the related art.
Figure 3:
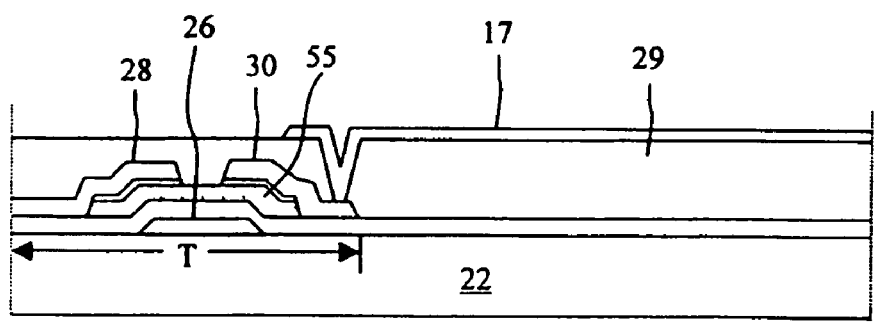
FIG. 3 is a cross-sectional view taken along II-II of FIG. 2.
Figure 4A:
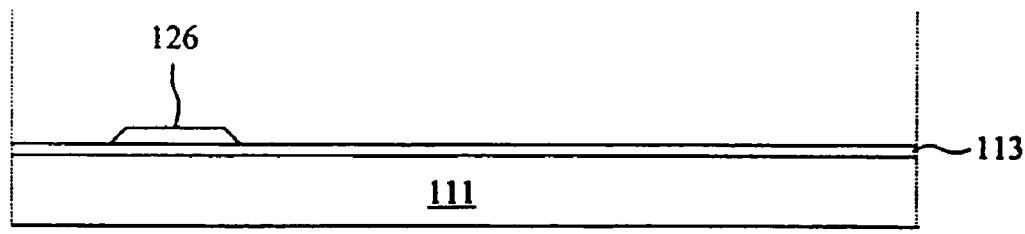
FIGS. 4A to 4F are cross-sectional views showing an exemplary fabricating sequence according to the present invention.

FIGS. 4A-4F show an exemplary process for forming an inverse staggered type thin film transistor of a back channel etch structure according to the present invention. In FIG. 4A, a buffer layer 113 may be formed on a substrate 111 by deposition, for example. The buffer layer 113 may include an insulating material such as silicon oxide ($SiO_2$), silicon nitride ($SiN_x$), for example, and the substrate 111 may include a metal material that can be easily etched away. The buffer layer 113 improves deposition quality of conductive lines subsequently formed thereon, and protects metal ions of the substrate from migrating into the conductive lines. Next, a conductive metal material selected from a group of aluminum (Al), aluminum alloy, molybdenum (Mo), and tungsten (W), for example, may be deposited on the buffer layer 113. The conductive metal material is subsequently patterned to form a gate line (not shown in figure) and a gate electrode 126. In addition, an anodized film (not shown) may be formed on the gate electrode 126.

Figure 4B:
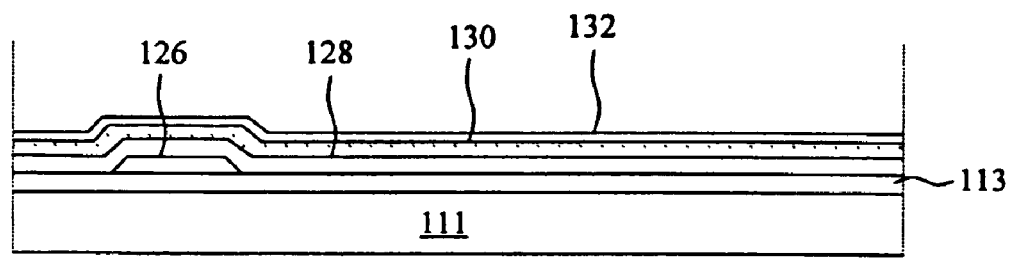

In FIG. 4B, a gate insulating layer 128 may be formed on the gate electrode 126 by deposition or coating of an inorganic insulating material selected from a group including silicon oxide ($SiO_2$) and silicon nitride ($SiN_x$), for example, or an organic insulating material selected from a group including benzocyclobutene and an acrylic resin, for example. Subsequently, an intrinsic semiconductor layer 130 and an extrinsic doped semiconductor layer 132 may be formed on the gate insulating layer 128 by deposition of intrinsic amorphous silicon and doped amorphous silicon, respectively.

Figure 4C:
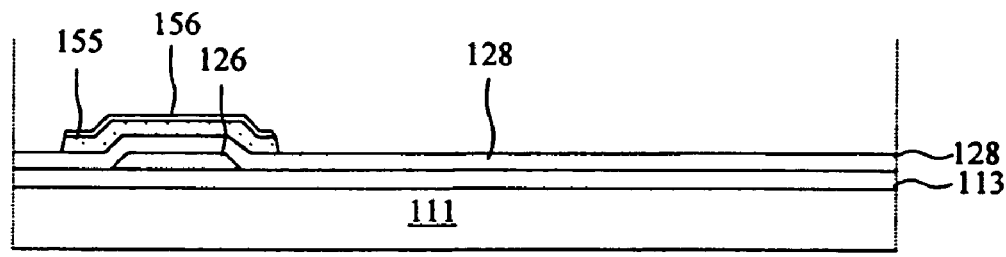

In FIG. 4C, an active layer 155 and an ohmic contact layer 156 may be formed to overlap over the gate electrode 126 by patterning the intrinsic semiconductor layer 130 and the doped semiconductor layer 132.

Figure 4D:
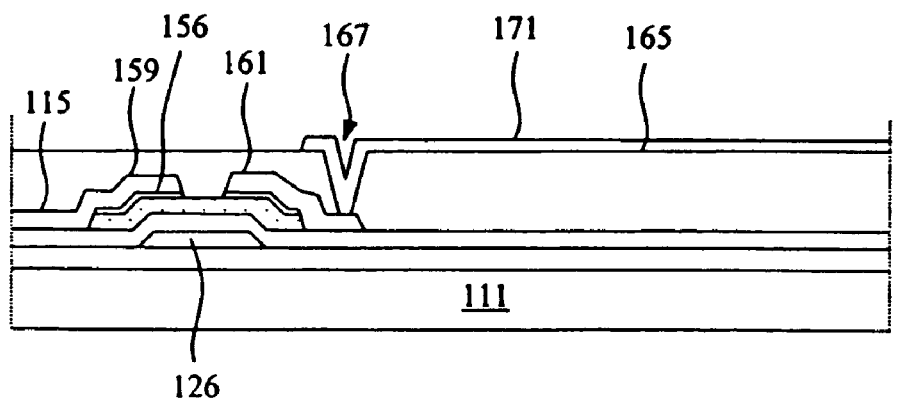

In FIG. 4D, a source electrode 159 and a drain electrode 161 may be formed by deposition of a conductive metal material selected from a group including molybdenum (Mo), tungsten (W), chromium (Cr), and an aluminum alloy, for example, on the ohmic contact layer 156. Subsequently, the conductive metal material is patterned to form the source and drain electrodes 159 and 161, and a data line 115 extending perpendicularly from the source electrode 159, which, in combination with the crossing gate line (not shown), defines a pixel region.

After forming the source and drain electrodes 159 and 161, a passivation layer 165 may be formed by deposition or coating of an insulating material on the substrate. Then, a drain contact hole 167 may be formed over the drain electrode 161. The passivation layer 165 may include benzocyclobutene and an acrylic resin, for example, and the passivation layer may be formed flat as shown in the FIG. 4D. Then a pixel electrode 171 may be formed by deposition of a transparent conductive metal material including indium-tin-oxide (ITO) and indium-zinc-oxide (IZO), for example, on the passivation layer 165. Subsequently, the transparent conductive metal material may be patterned, thereby forming the pixel electrode 171. The pixel electrode 171 may contact the drain electrode 161 through the drain contact hole 167. In addition, although not shown in the figures, an orientation film may be formed on the pixel electrode 171.

Figure 4E:
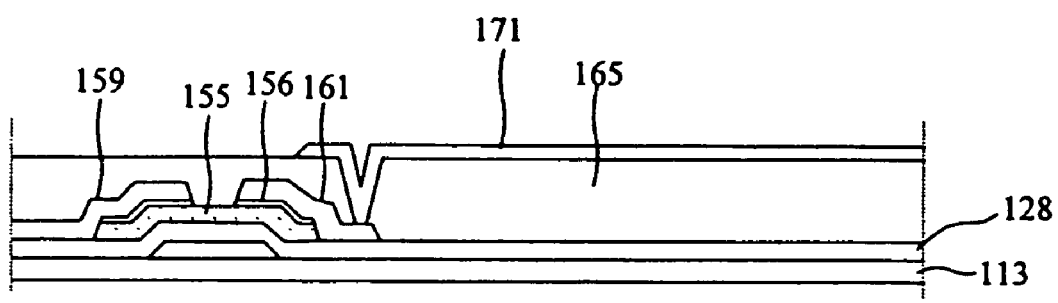

In FIG. 4E, the metal substrate 111 is removed by etching, for example, thereby exposing the buffer layer 113 to ambient conditions.

Figure 4F:
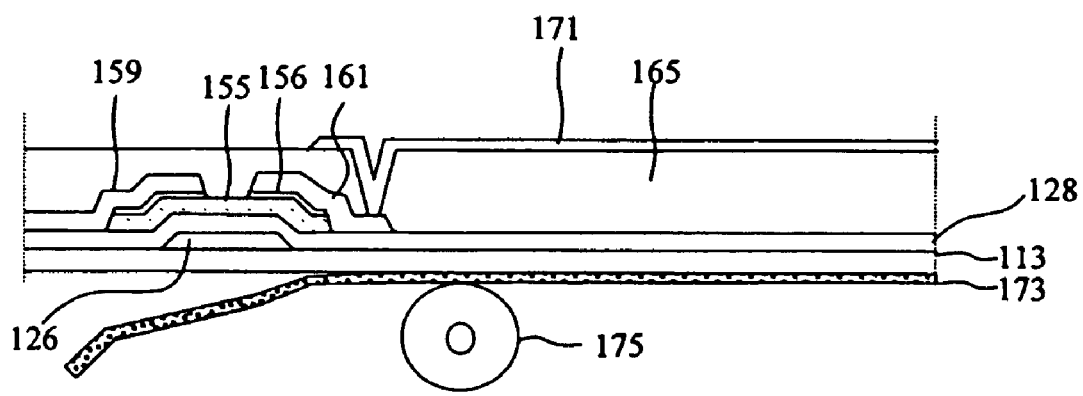

In FIG. 4F, an elastic material 173, i.e., plastic, may be applied beneath the buffer layer 113 using a roller 175, for example, to give the elastic material a support force and flatness. Accordingly, the applied elastic material may function as a lower substrate. The elastic material for coating may be selected from a group including polycarbonate (PC) and polystyrene, for example.

Alternatively, instead of using the roller for applying the elastic material to the buffer layer 113, the entire array substrate may be dipped into a melted elastic solution after the metal substrate is etched away. Then, a portion of the elastic material coated on an upper part of the array substrate may be removed, and a portion of the elastic material coated beneath the buffer layer 113 is shaped flat. By using either method, the flexible array substrate may be fabricated and damage to the array substrate can be prevented during subsequent assembling processes.

It will be apparent to those skilled in the art that various modifications and variations can be made in the method of manufacturing an array substrate of the present invention without departing from the spirit or scope of the invention. Thus, it is intended that the present invention cover the modifications and variations of this invention provided they come within the scope of the appended claims and their equivalents.

What is claimed is:

1. A method of fabricating an array substrate, comprising the steps of:
    forming a buffer layer on a metal substrate;
    forming a thin film transistor including a gate electrode, a source electrode and a drain electrode on the buffer layer;
    forming a pixel electrode contacting the drain electrode;
    removing the metal substrate to expose a lower surface of the buffer layer; and
    forming a plastic material beneath the buffer layer such that the plastic material contacts the exposed lower surface of the buffer layer.

2. The method according to claim 1, wherein the substrate is removed by an etchant.

3. The method according to claim 1, wherein the step of forming a plastic material includes at least using a roller to apply the plastic material to the buffer layer.

4. The method according to claim 1, wherein the buffer layer includes at least one of silicon oxide ($SiO_2$) and silicon nitride ($SiN_x$).

5. The method according to claim 1, wherein the gate electrode includes at least one of aluminum (Al), aluminum alloy, molybdenum (Mo), and tungsten (W).

6. The method according to claim 1, wherein the source and drain electrodes include at least one of molybdenum (Mo), tungsten (W), chromium (Cr), and an aluminum alloy.

7. The method according to claim 1, wherein the pixel electrode includes at least one of indium-tin-oxide (ITO) and indium-zinc-oxide (IZO).

8. The method according to claim 1, wherein the plastic material includes at least one of polycarbonate (PC) and polystyrene.

* * * * *